(12) United States Patent
Tsukamoto

(10) Patent No.: US 6,171,946 B1
(45) Date of Patent: *Jan. 9, 2001

(54) PATTERN FORMATION METHOD FOR MULTI-LAYERED ELECTRONIC COMPONENTS

(75) Inventor: Masahide Tsukamoto, Nara (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/896,071

(22) Filed: Jul. 17, 1997

(30) Foreign Application Priority Data

Jul. 22, 1996 (JP) .................................................. 8-191896

(51) Int. Cl.[7] .............................................. H01L 21/4763
(52) U.S. Cl. ......................................... 438/623; 438/624
(58) Field of Search .................................... 438/622, 623, 438/624

(56) References Cited

U.S. PATENT DOCUMENTS 5,807,763 * 9/1998 Motika et al. ........................ 438/637

* cited by examiner

Primary Examiner—Brian Dutton
(74) Attorney, Agent, or Firm—Morrison & Foerster LLP

(57) ABSTRACT

A method of forming a multilayered pattern in an electronic part wherein a pattern of multilayer wiring is formed via insulating layers in which a pattern for a succeeding layer is formed by adjusting to a position and a configuration of the pattern which was already formed by recognizing a position and configuration of the pattern.

18 Claims, 6 Drawing Sheets

PATTERN FORMATION METHOD FOR MULTI-LAYERED ELECTRONIC COMPONENTS

FIELD OF THE INVENTION

The present invention relates to a method of forming a multilayered wiring pattern by which a fine wiring pattern of a multilayered structure is formed with high density, direct plotting equipment in which the method of forming is employed and electronic parts such as a multilayered wiring substrate manufactured by the method.

BACKGROUND OF THE INVENTION

Recently, the development of the miniaturization and high-density mounting of electronic parts used for electronic equipment has been carried out to respond to requests for multifunction capability, miniaturization and reduction in weight of electronic equipment such as personal computers and picture acoustic equipment. Especially, the design rule of semiconductor apparatus such as LSI has been hyperfined, the wiring pitch of the printed wiring substrate used for mounting the electronic parts with high density has been reduced to a minimum and multilayered wiring is formed on the printed circuit board.

The density of multilayered device such as multilayered printed wiring substrates and MCM multilayered substrate or devices on which multilayered structure wiring is formed such as LSI has been increased, so the demand has grown for a wiring pattern having a fine structure. On the other hand, it is also required for the device to be manufactured at low cost. It is very difficult to solve both the above-mentioned problems at the same time. One of the solutions concerning the production technique is such that the device is manufactured on a large scale. For example, in manufacturing multilayered printed circuit boards, it is very effective to manufacture a large number of printed circuit boards at a time by using one piece of large scale substrate, in the so-called multi-production technique, to reduce the production cost for each piece of the printed circuit board. In order to achieve the above-mentioned effect, in the printed circuit board industry, a process is employed in which a large scale square substrate having a side of about 500 mm is used to manufacture a large number of printed circuit boards. In addition to that, in the semiconductor substrate industry, a process in which a large number of LSI are formed on an 8-inch silicon wafer is employed. Taking advantage of high level heat-resistance, the change in size due to shrinkage caused by firing of the ceramic multilayered substrate used for electronic controller such as automobile is large, therefore, in general, a square ceramic multilayered substrate having a length about 100 to 300 mm, which is smaller than that of printed circuit board, is used.

Hereinafter, a conventional method of forming multilayered pattern such as the above-mentioned printed circuit board will be explained. FIGS. 5A–5F show a process for forming a multilayered printed circuit board by a conventional manufacturing method. This conventional method of manufacturing a printed circuit board comprises the following steps:

(a) coating photosensitive insulating layer 505 on a top surface of glass epoxy multilayered wiring board 504 comprising an inside wiring pattern 501, a top surface wiring pattern 502 and a bottom surface wiring pattern 503 (as shown in FIG. 5A);

(b) locating a first mask 506 on which a pattern is formed to form a via hole to fit the top surface wiring pattern 502 formed on the insulating layer 505 (as shown in FIG. 5B);

(c) removing the insulating layer 505 at the position of a via hole to be punched by exposing over the first mask 506 by photolithography to form a via hole 507 (as shown in FIG. 5C);

(d) activating the inside wall of the via hole 507 with Sn-Pd to give conductivity and plating Cu to form a conductive layer 508 on the whole surface of the inside wall of the via hole 7 (as shown in FIG. 5D);

(e) locating a second mask having a pre-designed wiring pattern on the conductive layer 508 (as shown in FIG. 5E); and (f) exposing by the photolithography or etching to form a wiring pattern 510 to be achieved(as shown in FIG. 5F).

A basic method of manufacturing a semiconductor device such as an LSI device is the same as that of the above-mentioned method of manufacturing a printed circuit board. The method of manufacturing a semiconductor device comprises the following steps:

(a) forming a bottom side wiring pattern of an aluminum deposited film or sputtered film on a top surface of silicon wafer on which an active element or a passive element is formed;

(b) covering the bottom side wiring pattern with a dielectric layer composed of silicon oxide and forming a via hole by photolithography;

(c) forming a conductive layer by sputtering or depositing; and (d) forming a top side wiring pattern by photolithography in the same way. In the above-mentioned process of forming a wiring pattern of an LSI, the accurate positioning of the mask is required when photolithography is employed in the same way as that of the method of manufacturing a printed circuit board. Further, a passive element and an active element are manufactured by repeating photolithography a plurality of times.

As above-mentioned, the number of electronic parts per one piece of work substrate (one piece of unit substrate on which a large number of electronic parts are multi-produced at the same time, for example, an 8-inch silicon wafer for LSI) has to be increased in order to reduce the production cost of the electronic parts of the printed circuit board or LSI. However, in the above-mentioned conventional method of forming a wiring pattern, the size of the work substrate becomes bigger, and accuracy of positioning becomes lower. In addition to that, the coefficient of thermal expansion of the mask, the substrate material and the conductive layer used in the conventional method of forming are different, therefore a difference of size is caused and consequently the yield is lowered. For example, a printed circuit board comprising glass epoxy as substrate comprises inorganic glass fiber and organic epoxy resin in the substrate and a wiring pattern composed of metallic material is formed thereon. Accordingly, in general, the thermal expansions of the materials composing the printed circuit board are different and during the manufacturing process, the material is stressed by applying pressure and heat. Therefore it is very difficult for photolithography to improve the size accuracy which a plurality of material is layered and mask is aligned. Further, as the number of layers in the wiring patterns increases, the difficulty of improving the size accuracy increases accordingly.

FIG. 6 shows an example of a work board for multi-production employed in a general method of forming a wiring pattern. As shown in FIG. 6, twenty five pieces of printed circuit boards 602 on which a wiring pattern 604 and a via hole 605 are formed are formed by using work board 601. Element 603 indicates a reference bore which is used to maintain the accuracy of the size in aligning the mask when photolithography is employed. As shown in FIG. 7, due to the change of size caused by thermal expansion, some parts of via hole 605 for connecting a wiring pattern 604 of the surface layer with a wiring pattern 701 of the under layer can not be accurately positioned. When some part of via hole 605 deviates as indicated by 605a, the electrical connection becomes unstable, and the reliability of the manufactured product is lowered. Further, when the position of the via hole deviates entirely, as indicated by 605b, the manufactured product becomes inferior, and production yield is lowered.

In general, when a square work board having 500 mm side is used, it is difficult to make a size error in positioning of 100 µm or smaller. As mentioned above, when the density of wiring pattern becomes higher, the difficulty of reducing size error in positioning increases.

This invention provides a method of forming multilayered wiring patterns in which respective wiring patterns can be formed with high accuracy without being affected by the change of size caused by difference of coefficient of thermal expansion of the respective materials even if the size of work board becomes large to reduce production cost. This invention also provides a method of forming multilayered wiring patterns in which a plurality of wiring patterns formed for a multilayer circuit can be connected accurately with via holes, so that production yield can be improved and electronic parts excellent in reliability can be produced at low cost.

SUMMARY OF THE INVENTION

This invention provides a method of forming multilayered patterns for electronic parts such that a pattern of wiring is formed for a multilayer circuit via an insulating layer in which the position and configuration of pattern which were already formed are recognized and a pattern for succeeding layers can be formed having a suitable configuration at a suitable position by adjusting it to the pattern which was already formed. According to the invention in which a succeeding wiring pattern and a succeeding via hole are formed by adjusting them to the configuration of the wiring pattern and via hole which were already formed, a wiring pattern of high accuracy can be formed, a plurality of wiring patterns can be connected accurately through via holes, thereby increasing production yield and providing electronic parts excellent in reliability.

According to the invention, in a method of forming a multilayered pattern of electronic parts having a structure such that a wiring pattern is formed for a multilayer circuit via an insulating layer, the position and the configuration of the patterns which were already formed are recognized and a pattern for a succeeding layer having a suitable configuration is formed at a suitable position by adjusting it to the pattern which was already formed. Unlike the conventional method of forming a wiring pattern in which a pattern mismatch caused by mask alignment can occur, according to the invention, a wiring pattern for a succeeding layer which was already designed is transformed to be formed based on the position and the configuration of the wiring pattern which was already formed, so pattern mismatch caused by mask alignment can be prevented. Accordingly, the size of work board for multi-production can be enlarged, production cost can be decreased by increasing production yield and electronic parts excellent in reliability can be provided.

According to a preferred embodiment of this invention, after an insulating layer is coated on a top surface of a first wiring pattern, the first wiring pattern is partially exposed, so that the first wiring pattern can be recognized optically with high accuracy, as it is not being obstructed by the insulating layer.

According to a preferred embodiment of this invention, an equipment for forming an electronic part having a constitution such that a wiring pattern is formed for multilayer via insulating layer of this invention is a direct plotting equipment for manufacturing a multilayer pattern comprising at least an equipment for recognizing a pattern, an equipment for transforming and forming patterns for a succeeding layer or layers based on the recognized pattern and a laser equipment for direct processing or direct plotting based on the formed pattern. This invention can be performed effectively using the above-mentioned equipment, so that electronic parts having a multilayered pattern of high accuracy can be manufactured at low cost.

According to a preferred embodiment of this invention, a direct plotting equipment for multilayer circuit comprises X-ray irradiating equipment and an electronic camera as recognizing means by which a pattern for a succeeding layer can be designed and plotted by recognizing and referring to a plurality of wiring patterns, which are selected at random and which were already formed on a wiring board composed of a synthetic resin such as epoxy.

According to a preferred embodiment of this invention, a direct plotting equipment for multilayer comprises an electronic camera and a storing equipment as recognizing means, a large number of different wiring patterns can be stored at the same time during the manufacturing process for a wiring board or multilayered device composed of inorganic material such as ceramic substrate or silicon substrate and the wiring patterns of the product can be formed with high accuracy, therefore a variety of kinds of products can be manufactured at high speed in one production line.

A preferred method of this invention comprises the following steps of:
 forming a first wiring pattern having a predetermined configuration composing a first conductive layer on a surface of a supporting substrate composed of insulating material;
 recognizing a position and a configuration of the first wiring pattern by recognizing means;
 covering a top surface of the first wiring pattern with an insulating layer;
 providing a via hole on a top surface of the insulating layer at a predetermined position by boring means adjusting to the position and the configuration of the first wiring pattern based on a picture signal detected by the recognizing means;
 providing conductive material in the via hole and forming a second conductive layer on the whole surface of the insulating layer;
 forming a photoresist film on the top surface of the second conductive layer, and plotting and sensitizing a second wiring pattern having a predetermined configuration on the photoresist layer based on a picture signal detected by the recognizing means;
 etching a second conductive layer via a sensitized and developed photoresist and removing the photoresist to form a second wiring pattern; and
 connecting electrically the first wiring pattern and the second wiring pattern through a via hole on which the insulating layer is provided to form a multilayered wiring board.

According to this example, a wiring pattern for a succeeding layer can be formed based on a position and a configuration of a wiring pattern which was already formed, or a wiring pattern for a succeeding layer can be formed easily by changing the configuration of the wiring pattern which was already formed and the position of the via hole. Unlike the conventional method, according to the invention, pattern mismatch can be completely restrained from occurring. Consequently, the size of the work board used in mass-production can be enlarged. For example, like the build-up method which will be explained in Example 1 and Example 2 below, when a multilayered wiring board is manufactured by forming a plurality of wiring patterns via insulating layers consequently on a top surface of a wiring board having a wiring pattern which was already formed, production yield is increased and production cost is lowered. Accordingly, a multilayered wiring board with high density and excellent in reliability can be manufactured.

Another preferred embodiment of the method of this invention comprises the following steps of:

forming a first wiring pattern having a predetermined configuration composed of a first conductive layer on a surface of a supporting substrate composed of an insulating material;

recognizing a position and a configuration of the first wiring pattern by recognizing means and bonding a second conductive layer composed of copper foil via an insulating adhesive resin layer on the surface of the first wiring pattern;

forming a photoresist layer on the surface of the second conductive layer and plotting and sensitizing a pattern of a via hole or holes in the photoresist layer at predetermined positions based on a picture signal of the configuration and the position of the first wiring pattern detected by the recognizing means;

forming an opening part for boring a via hole or holes in the second conductive layer by etching the second conductive layer via mask composed of the sensitized and developed photoresist;

forming a via hole or holes by boring means in a resin layer in the opening part;

plating copper in the via holes and on the whole surface of the second conductive layer; and forming a second wiring pattern by using plotting means to adjust the position and the configuration of the first wiring pattern based on a picture signal detected by recognizing means. As above-mentioned, this preferred embodiment employs simplified steps, so that a multilayered wiring board with high reliability can be manufactured at lower cost.

A preferred embodiment of this invention employs aramid fiber as the reinforcing material and aramid epoxy sheet in which epoxy resin is impregnated as the supporting substrate composed of insulating material or insulating layer. Accordingly, a multilayered wiring board excellent in heat-resistance and on which high-density wiring can be performed can be obtained.

Another preferred embodiment of this invention uses glass fiber as the reinforcing material and an epoxy substrate in which epoxy resin is impregnated. Accordingly, a multilayered wiring board excellent in mechanical strength, reliability and impact-resistance can be obtained.

Another preferred embodiment of the method of this invention comprises the following steps of:

recognizing a pattern on a multilayered substrate comprising a ceramic as an insulating layer and a plurality of layers of a conductive pattern formed therein by recognizing means and storing the information;

forming a conductive layer on a surface of the multilayered substrate;

coating a photoresist on a whole surface of the conductive layer;

plotting a pattern, which is formed by calculation based on the information stored by recognizing means, on the photoresist; and removing the photoresist selectively, dissolving and removing unnecessary parts of the conductive layer by etching to form a multilayered wiring board.

Accordingly, an accurate wiring pattern adjusting to a position of a via hole with accuracy can be formed based on a picture information which is obtained by recognizing the pattern and storing on a top surface of a multilayered substrate which is composed of inorganic material as the insulating material.

Yet another preferred embodiment of a method of this invention of forming a multilayered pattern for a semiconductor device comprising a plurality of diffusion areas and wirings comprises the following steps of;

recognizing by recognizing means a position and a configuration of at least one of a plurality of patterns which were already formed; and forming a succeeding diffusion pattern, a succeeding contact window or a succeeding wiring pattern by plotting means or by photolitho technique adjusting to the recognized pattern to manufacture a semiconductor equipment. Accordingly, an LSI chip excellent in reliability can be manufactured using a large scale of work substrate (silicon wafer) with high efficiency.

A preferable example of a method of forming a multilayered pattern for a liquid crystal display device comprising a plurality of TFT and wirings comprises the following steps of;

recognizing by recognizing means a position and a configuration of at least one of a plurality of patterns which were already formed; and forming a succeeding pattern or a succeeding wiring pattern by plotting means or by a photolitho technique adjusting to the recognized pattern to manufacture a liquid crystal display equipment.

Accordingly, liquid crystal display equipment, which is used as display panel for a television or a computer monitor, having excellent display quality, fewer point defects such as white spots, etc., can be obtained.

A preferred embodiment of a method of forming a multilayered pattern employs a laser beam machine as a boring means. Accordingly, a via hole having a smaller size can be formed for connecting a plurality of layers of terminals electrically which are wired with high density and have a fine design rule.

Another preferred embodiment of a method of forming a multilayered pattern employs a laser direct plotting machine as a plotting means. Accordingly, a wiring pattern having more accuracy and which is finer can be formed in comparison with a wiring pattern manufactured by a photolitho technique in which a conventional mask is employed.

According to a preferred example of this invention, electronic parts which are formed by the above-mentioned method of forming a multilayered pattern, excellent in high production yield and reliability, can be obtained.

According to a preferred embodiment of this invention, an electronic part is any of a multilayered wiring board, semiconductor equipment or liquid crystal display equipment excellent in reliability.

According to a preferred embodiment of this invention, a pattern for recognizing a position is formed for each layer in order to carry out this invention effectively. Accordingly, multilayered circuit boards with higher accuracy can be obtained.

THE DETAILED DESCRIPTION OF THE INVENTION

Figure 1A:
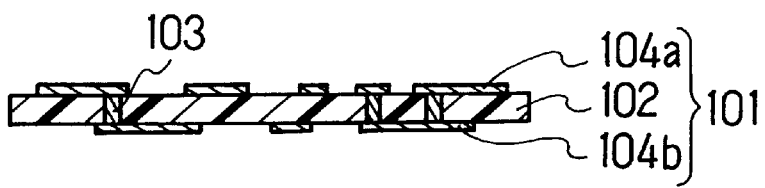
FIG. 1A is a schematic diagram to explain a process of forming multilayered patterns in a first embodiment of this invention.

Hereinafter, the details of this invention will be explained referring to the drawings.

Figure 1B:
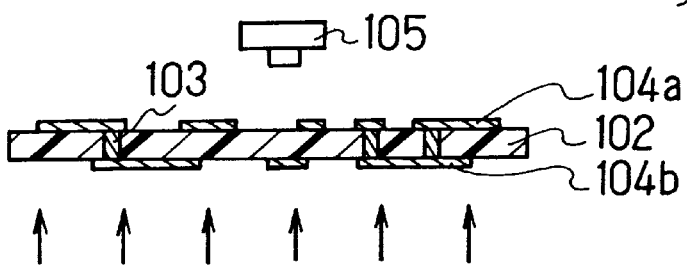
FIG. 1B is a schematic diagram to explain a process of forming multilayered patterns in a first embodiment of this invention.

FIGS. 1A–1G are sectional views showing a process of manufacturing multilayered pattern according to a first embodiment of this invention. In FIGS. 1A–1G, 101 indicates a double-side printed circuit board. On a surface of an epoxy substrate 102 in which aramid fiber is provided as a reinforcing fiber and epoxy resin is impregnated, a first wiring pattern 104a and 104b, which are electrically connected through via hole 103, having a predetermined configuration are formed. On a top surface of the double-side printed circuit board 101, an electronic camera 105 such as CCD is provided as a recognizing means to read the position and the configuration of first wiring pattern 104a, and the information is stored in a storing means(FIG. 1B). Further, X-rays can be irradiated from a back side of the double-side printed circuit board 101 and the obtained transmission picture can be read by electronic camera 105. In this case, not only first wiring pattern 104a but also the position and the configuration of a first wiring pattern 104b formed on a back side of the double-side printed circuit board 101 can be read. Accordingly, in forming second and third wiring patterns in a following step, the information about a plurality of wiring patterns which were already formed can be used to position and configure the second and third wiring patterns.

Figure 1C:
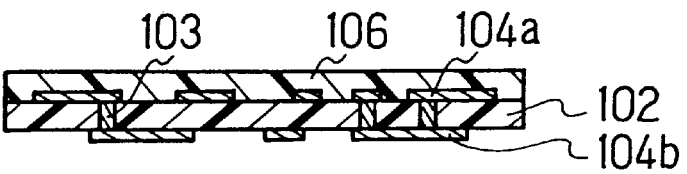
FIG. 1C is a schematic diagram to explain a process of forming multilayered patterns in a first embodiment of this invention.
Figure 1D:
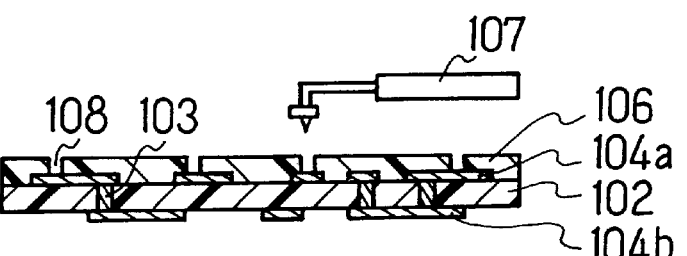
FIG. 1D is a schematic diagram to explain a process of forming multilayered patterns in a first embodiment of this invention.
Figure 1E:
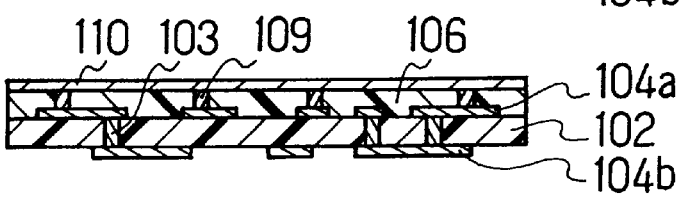
FIG. 1E is a schematic diagram to explain a process of forming multilayered patterns in a first embodiment of this invention.
Figure 1F:
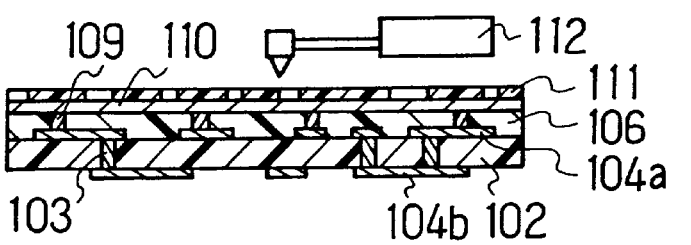
FIG. 1F is a schematic diagram to explain a process of forming multilayered patterns in a first embodiment of this invention.
Figure 1G:
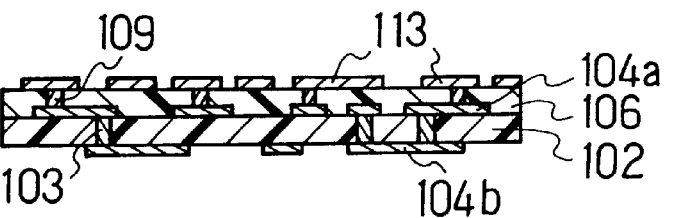
FIG. 1G is a schematic diagram to explain a process of forming multilayered patterns in a first embodiment of this invention.

As shown in FIG. 1C, on a top surface of first wiring pattern 104a, insulating layer 106, which is preferably composed of photosensitive resin, is coated, a via hole 108 is formed by boring means 107 such as as a laser beam machine at a required position based on picture information of position and configuration of the first wiring pattern which was recognized and stored by electronic camera 105.(FIG. 1D) Via hole 108 can be bored directly by energy irradiated from the laser beam machine. When insulating layer 106 composed of photosensitive resin is used, a via hole can be also formed by developing and removing a portion which is sensitized by laser beam. In this case, a via hole can be formed only by sensitizing the insulating layer with a laser beam, so the laser beam can be moved at high speed, consequently a via hole can be formed at high speed.

After conductive material 109 is formed inside of via hole 108, a second conductive layer 110 composed of copper foil is layered on the whole top surface of insulating layer 106 and via hole 108.(FIG. 1E) Conductive material 109 may be conductive paste or gilding. Conductive layer 110 may be formed by pasting conductive foil, by gilding, by sputtering or by deposition.

As shown in FIG. IF, a second wiring pattern 113 connected electrically with first wiring pattern 104a through via hole conductive material 109 is obtained by the following steps of;

plotting the necessary pattern on photoresist 111 coated with the second conductive layer 110 based on the picture information of the first wiring pattern 104a or 104b recognized and stored by electronic camera 25 in the same way as forming the via hole 108 using laser direct plotting machine 112 as plotting means; and developing and removing the sensitized parts and etching the second conductive layer 110.

Via hole 108 and second wiring pattern 113 are formed based on the picture information of position and configuration of first wiring pattern 104 which was already formed, so that even if the first wiring pattern 104 is deformed by stress such as pressure and heat applied to it during the manufacturing process, pattern mismatch, which can often occur in the conventional mask alignment, does not occur at all.

In this embodiment of this invention, an example in which a double-side printed circuit board which is connected through via hole was explained, but a one-side printed circuit board, or a multilayered wiring board in which inside wiring is formed through via through holes, can also be used. The same effect can be obtained by using glass epoxy substrate instead of using an aramid epoxy substrate.

In this example of this invention, a method of forming a second wiring pattern 113 was explained, however, a third and a fourth wiring pattern can be formed on the second wiring pattern in the same way.

This embodiment can be conducted simply by multilayer pattern plotting equipment comprising the following elements:

means for recognizing a picture of a first wiring layer and for storing a digital pattern;

means for calculating a position of a via hole based on the pattern or deforming and for forming a second wiring layer which was already formed; and a laser by which processing or plotting is conducted directly.

A pattern recognizing device in which X-rays are used as the light source for detecting an inner layer through the substrate, or a simple electronic reading device, in which visible light which can detect only the surface layer, can be used.

(Second embodiment)

Hereinafter the details of a second embodiment of this invention will be explained.

Figure 2A:
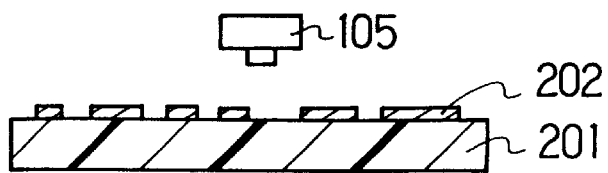
FIG. 2A is a schematic diagram to explain a process of forming multilayered patterns in a second embodiment of this invention.
Figure 2B:
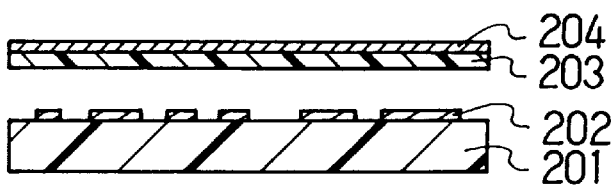
FIG. 2B is a schematic diagram to explain a process of forming multilayered patterns in a second embodiment of this invention.
Figure 2C:
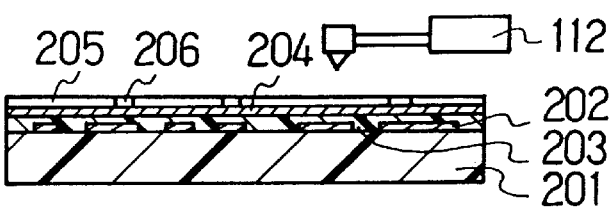
FIG. 2C is a schematic diagram to explain a process of forming multilayered patterns in a second embodiment of this invention.
Figure 2D:
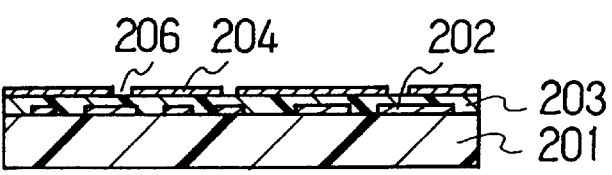
FIG. 2D is a schematic diagram to explain a process of forming multilayered patterns in a second embodiment of this invention.
Figure 2E:
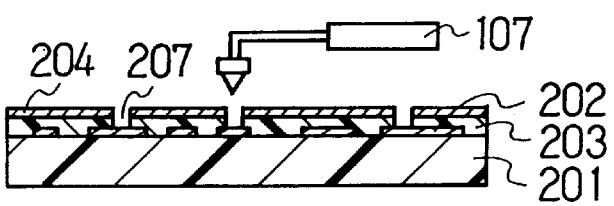
FIG. 2E is a schematic diagram to explain a process of forming multilayered patterns in a second embodiment of this invention.
Figure 2F:
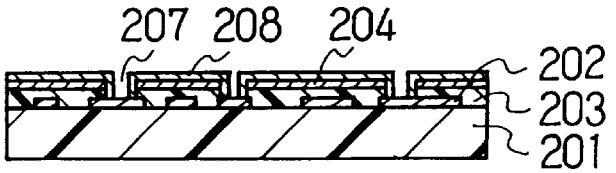
FIG. 2F is a schematic diagram to explain a process of forming multilayered patterns in a second embodiment of this invention.

FIGS. 2A–2H are sectional views showing a process of manufacturing multilayered pattern according to a second embodiment of this invention. In FIG. 2A, a position and a configuration of a first wiring pattern 202 formed on a surface of an aramid epoxy substrate 201 (comprising aramid fiber as a reinforcing material and in which epoxy resin is impregnated) by etching the first conductive layer selectively is read by an electronic camera 105 in the same way as the first example and is recognized and stored. Next, as shown in FIG. 2B, a second conductive layer 204 composed of copper foil on which insulating layer 203 is coated is applied on a top surface of a first wiring pattern 202 via the insulating layer 203 of the second conductive layer 204. Further, photoresist layer 205 is coated on the top surface, an opening part is sentised and developed and the removed to form via holes at required positions by adjusting them to positions of the first wiring pattern by laser direct plotting machine 112 based on picture information which was recognized in the previous process, and an opening part 206 is formed.(FIG. 2C) Next, as shown in FIG. 2D, second conductive layer 204 is etched to expose the insulating layer 203 of the opening part 206, the conductive layer is removed by etching using the second conductive layer 204 as mask and a via hole 207 is formed. As shown in FIG. 2E, a via hole 207 can be formed by using a laser beam machine.

Figure 2G:
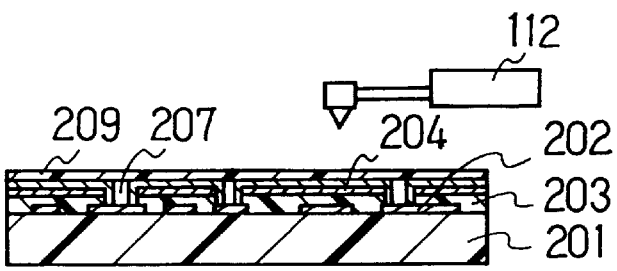
FIG. 2G is a schematic diagram to explain a process of forming multilayered patterns in a second embodiment of this invention.
Figure 2H:
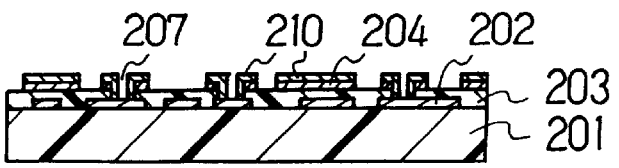
FIG. 2H is a schematic diagram to explain a process of forming multilayered patterns in a second embodiment of this invention.

Next, copper plating 208 is applied to the whole surface of the second conductive layer 204 and a via hole to be integrated as a second conductive layer 204 (FIG. 2F), as shown in FIG. 2G., the necessary wiring pattern, based on the picture information of first wiring pattern 202 which was recognized and stored by electronic camera 205 in the same way of forming via hole 207, was plotted on photoresist 209 coated on the second conductive layer 204 by laser direct plotting machine 112 as the plotting means. After the sensitized parts are developed and removed, a second wiring pattern 210 connected electrically with the first wiring pattern 202 through via hole 207 is obtained by etching the second conductive layer 204.(FIG. 2H)

In the same way as the first embodiment of this invention, a via hole 207 and a second wiring pattern 210 are formed based on picture information of a position and a configuration of a first wiring pattern which was already formed, so that even if the first wiring pattern 202 is deformed by stress such as pressure and heat applied to it during the manufacturing process, pattern mismatch, which often occurred in conventional mask alignment, does not occur at all.

Further, in the second embodiment of this invention, an example in which an organic material is used for the supporting substrate composed of insulating material was explained. However, when a wiring pattern is formed on a top surface of a multilayered circuit board, in which multilayered wiring is formed inside, and which comprises a ceramic as the insulating material used for electronic equipment which is conventionally required to have high degree of heat-resistance, the same method of forming as that of the second embodiment can be applied. In this case, when a ceramic substrate is used, shrinkage caused by the firing of the ceramic occurs, so that the size of the pattern is not fixed. Therefore a pattern on the surface layer is formed after the ceramic substrate is fired. Before a pattern in a wiring layer on the surface layer is formed, only a tip of the via hole is exposed. And the position of the tip of the via hole is not fixed due to unevenness caused by shrinkage during firing. Even in this case, according to this invention, the position of the via hole can be recognized in advance and the pattern in a wiring layer can be fired with the predetermined rate of shrinkage. As a result, the pattern mismatch between the via hole and the via pad does not occur. Accordingly, a size of a via hole and a via pad can be made small, so a wiring board with high density can be easily obtained.

In this embodiment, it is preferable that recognition of the pattern is performed just before plotting. The reason is that when plotting is conducted after some time has elapsed, it is possible that plotting is not accurately conducted since the environment is changed. It is effective to form a pattern for recognizing each layer in order to avoid the abovementioned possibility. A pattern can be layered with more accuracy by forming a plurality of patterns, one provided for each layer, and plotting a pattern for a succeeding layer by recognizing the preceding pattern.

It is difficult to detect a pattern optically after it is coated with insulating layer, but a recognition pattern can be read easily by removing the insulating layer positioned nearby the recognition pattern to expose the recognition pattern. It is effective to use a laser to remove the insulating layer. The recognition pattern may be exposed just before recognizing or may be exposed well beforehand.

(Third embodiment)

Hereinafter the details of a third embodiment of this invention will be explained.

Figure 3:
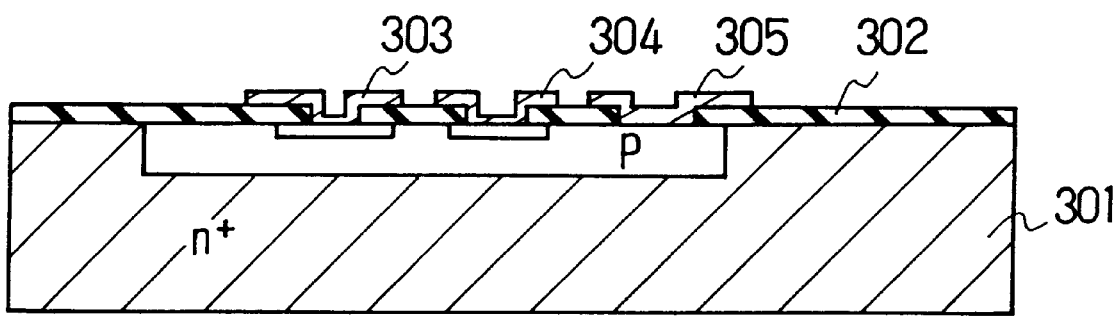
FIG. 3 is a sectional view showing semiconductor equipment to explain a method of forming multilayered patterns in a third embodiment of this invention.

FIG. 3 is a sectional view showing a semiconductor device manufactured by a method of forming a multilayered pattern in accordance with a third embodiment of this invention. In FIG. 3, element 301 indicates a work board composed of silicon wafer used for forming a plurality of semiconductor devices. An oxide film 302 on the silicone wafer, an opening of diffused layer, an emitter 303 acting as each electrode terminal, a collector 304 and a base 305 are formed by sequentially adjusting to a position and a configuration of the pattern which was already formed by the recognizing means and the plotting means as explained in the first and second embodiments. Therefore a pattern can be formed with high accuracy. Accordingly, semiconductor device excellent in reliability can be manufactured with high yield without being affected by deformation factors such as environmental temperature during the process of manufacturing.

(Fourth embodiment)

Hereinafter the details of a fourth embodiment of this invention will be explained.

Figure 4:
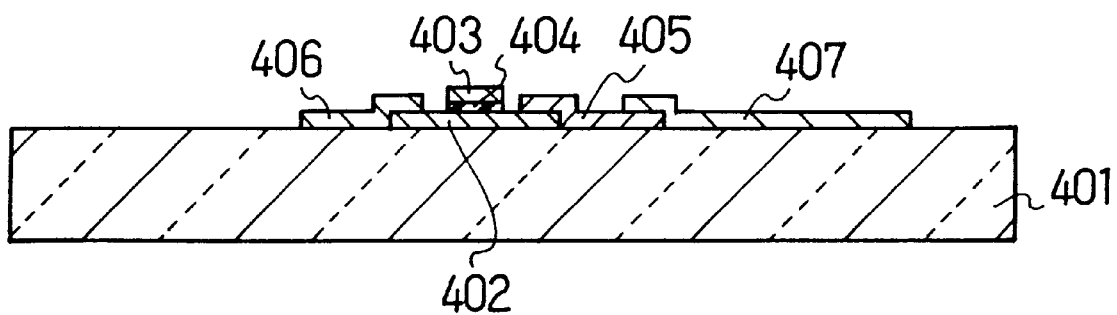
FIG. 4 is a sectional view showing TFT of a liquid crystal display device to explain a method of forming multilayered patterns in a fourth embodiment of this invention.
Figure 5A:
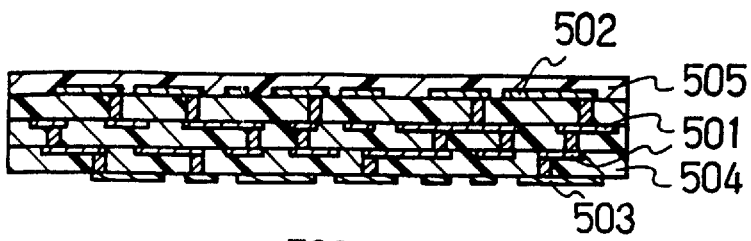
FIG. 5A is a schematic diagram to explain a process of forming a conventional multilayered pattern.
Figure 5B:
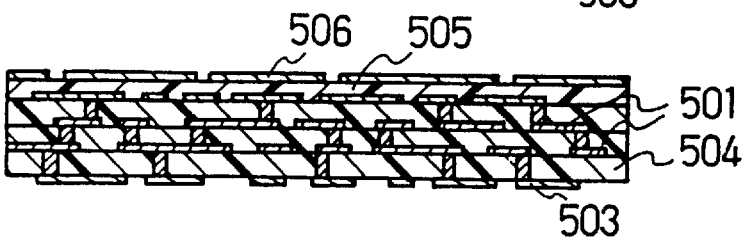
FIG. 5B is a schematic diagram to explain a process of forming a conventional multilayered pattern.
Figure 5C:
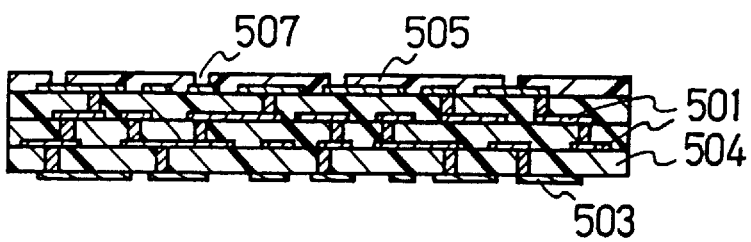
FIG. 5C is a schematic diagram to explain a process of forming a conventional multilayered pattern.
Figure 5D:
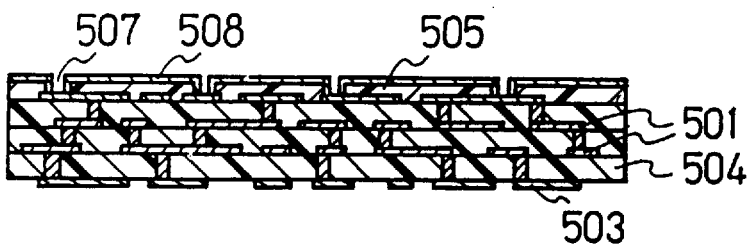
FIG. 5D is a schematic diagram to explain a process of forming a conventional multilayered pattern.
Figure 5E:
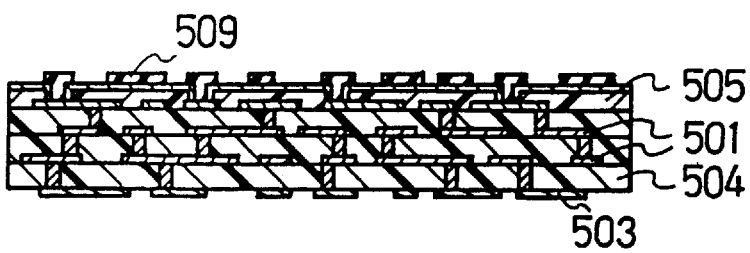
FIG. 5E is a schematic diagram to explain a process of forming a conventional multilayered pattern.
Figure 5F:
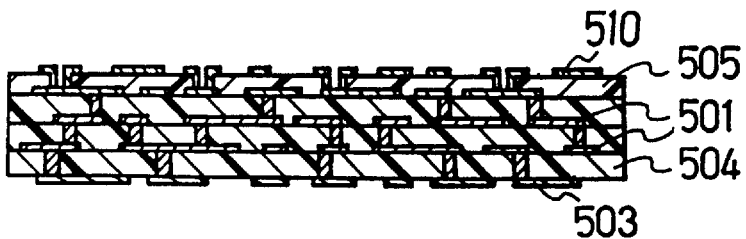
FIG. 5F is a schematic diagram to explain a process of forming a conventional multilayered pattern.
Figure 6:
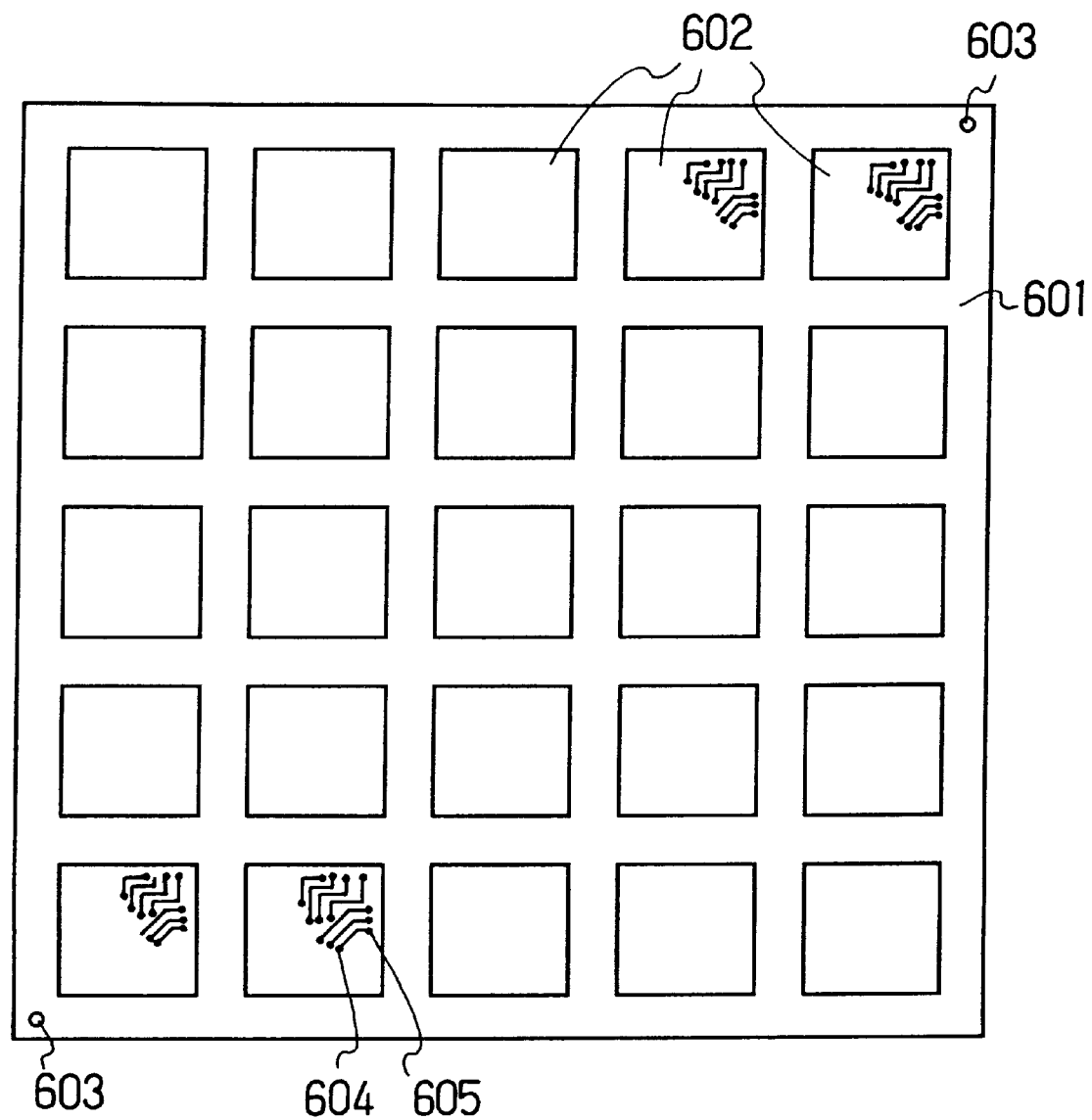
FIG. 6 is plan view showing a work board used for multi-production in general.
Figure 7:
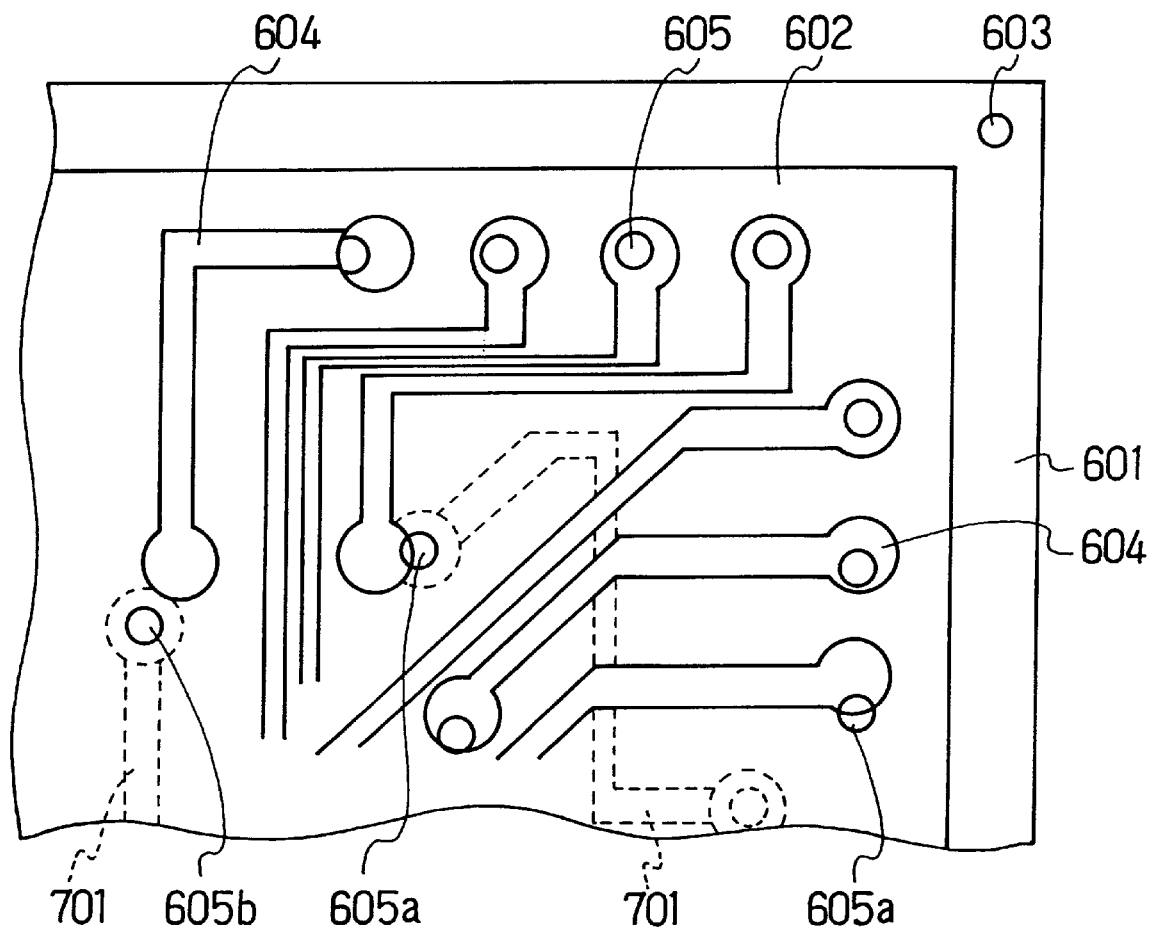
FIG. 7 is partially enlarged view showing a conventional work board used for multi-production.

FIG. 4 is a sectional view showing a TFT substrate used for a liquid crystal display manufactured by a method of forming multilayered pattern in accordance with a fourth embodiment of this invention. In FIG. 4, 401 indicates a transparent glass substrate. A transistor for driving liquid crystal material comprising a gate electrode 404, a drain 405 and a source 406 is formed on the transparent glass substrate 401 via semiconductor thin film 402, insulating oxide film 403 composed of $SiO_2$, and a plurality of transparent electrodes 407 composed of ITO which apply an electric charge to liquid crystal material connected to the drain 405 are formed on the transparent glass substrate 401. The pattern is formed sequentially adjusting to a position and a configuration of the pattern which was already formed by the recognizing means and the plotting means as explained in the first and second embodiments. Therefore, a pattern can be formed with high accuracy. Accordingly, a display equipment excellent in reliability can be manufactured with high yield without having defective property such as point defect caused by breakage of TFT.

As explained in the above-mentioned embodiments, this invention provides a method of forming a multilayered pattern in which a pattern for succeeding layer is formed adjusting to a position and a configuration of wiring pattern and a via hole which were already formed. Therefore a wiring pattern can be formed with high accuracy and a plurality of wiring patterns formed for multilayer can be connected with high accuracy through via holes.

In addition to that, even if the size of the work board is enlarged, each wiring pattern can be formed with high accuracy without being affected by changes in the size of the work board caused by thermal expansion, and production yield is also improved. Accordingly, an electronic part having a multilayered pattern can be manufactured at low cost.

This invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

What is claimed is:

1. A method of forming a multilayered pattern for an electronic part having a multilayered pattern of wiring formed on a multilayered wiring board via an insulating layer, the method comprising:

recognizing a first position and a first configuration of a first wiring pattern which was already formed in said electronic part; and forming a second pattern having a second configuration at a second position adjusted to the first position and the first configuration of the first pattern which was already formed.

2. A method of forming a multilayered pattern as claimed in claim 1, further comprising removing a portion of said insulating layer to expose a portion of said first pattern which was already formed so that said first position and said first configuration can be recognized.

3. A method of forming a multilayered pattern as claimed in claim 1, wherein said recognizing is carried out with a recognizing equipment which comprises a X-ray irradiating equipment and an electronic camera.

4. A method of forming a multilayered pattern as claimed in claim 1, wherein said recognizing is carried out with recognizing equipment which comprises an electronic camera and a storing equipment.

5. A method of forming a multilayered pattern as claimed in claim 1, further comprising:

forming said first wiring pattern comprising a first conductive layer having said first configuration on a surface of a supporting substrate comprising an insulating material;

covering a top surface of said first wiring pattern with said insulating layer;

providing a via hole on a top surface of said insulating layer at said first position with a boring means adjusted to said first position and said first configuration of said first wiring pattern based on a picture signal detected by recognizing means;

providing a conductive material in said via hole and forming a second conductive layer on a whole surface of said insulating layer;

forming a photoresist film on a top surface of said second conductive layer, and plotting and sensitizing said second wiring pattern having said second configuration on said photoresist film based on the picture signal detected by said recognizing means;

etching said second conductive layer through said sensitized photoresist film and removing said photoresist film to form said second wiring pattern; and connecting electrically said first wiring pattern and said second wiring pattern through said via hole to form the multilayered wiring board.

6. A method of forming a multilayered pattern as claimed in claim 1, further comprising:

forming said first wiring pattern comprising a first conductive layer having said first configuration on a surface of a supporting substrate comprising an insulating material;

bonding a second conductive layer by means of insulating bonding resin layer on a top surface of said first wiring pattern;

forming a photoresist layer on a top surface of said second conductive layer and plotting and sensitizing a pattern of a plurality of via holes in said photoresist layer at said first position based on a picture signal of said first configuration and said first position of said first wiring pattern detected by recognizing means;

forming an opening part for each of said plurality of via holes in said second conductive layer by etching said second conductive layer via a mask composed of said photoresist layer;

forming said plurality of via holes by boring into an adhesive resin layer in said opening part;

plating copper in said plurality of via holes and on the whole surface of said second conductive layer; and forming said second wiring pattern by plotting means which is adjusted to the first position and the first configuration of the first wiring pattern based on the picture signal detected by said recognizing means.

7. A method of forming a multilayered pattern as claimed in claim 5, wherein the supporting substrate comprises aramid fiber as a reinforcing material and an aramid epoxy sheet in which epoxy resin is impregnated.

8. A method of forming a multilayered pattern as claimed in claim 6, wherein the supporting substrate comprises aramid fiber as a reinforcing material and an aramid epoxy sheet in which epoxy resin is impregnated.

9. A method of forming a multilayered pattern as claimed in claim 5, wherein the supporting substrate comprises glass fiber as a reinforcing material and epoxy substrate in which epoxy resin is impregnated.

10. A method of forming a multilayered pattern as claimed in claim 6, wherein the supporting substrate comprises glass fiber as a reinforcing material and epoxy substrate in which epoxy resin is impregnated.

11. A method of forming multilayered pattern as claimed in claim 5, wherein said boring means is a laser beam machine.

12. A method of forming multilayered pattern as claimed in claim 6, wherein said boring means is a laser beam machine.

13. A method of forming multilayered pattern as claimed in claim 5, wherein said plotting means is laser direct plotting machine.

14. A method of forming multilayered pattern as claimed in claim 6, wherein said plotting means is laser direct plotting machine.

15. A method of forming multilayered pattern as claimed in claim 1, wherein a plurality of patterns for recognizing a position is formed for each wiring layer.

16. A method of forming a multilayered pattern as claimed in claim 1, further comprising:

recognizing a pattern on the multilayered wiring board comprising a ceramic as the insulating layer and a plurality of layers of conductive pattern formed in said multilayered wiring board and storing information of said pattern by a recognizing means;

forming a conductive layer on a top surface of said multilayered wiring board;

coating a photoresist film on a top whole surface of said conductive layer;

plotting said pattern based on the information stored by the recognizing means on the photoresist film; and removing said photoresist film selectively, and dissolving and removing any part of said conductive layer that is not necessary to form said multilayered wiring board by etching.

17. A method of forming a multilayered pattern for a semiconductor device comprising a plurality of diffusion areas and a plurality of multilayer wiring patterns formed via a plurality of insulating layers, comprising:

recognizing with recognizing means a first position and a first configuration of at least one of said plurality of diffusion areas or said plurality of multilayer wiring patterns which was already formed in an electronic part; and forming a succeeding wiring pattern, a succeeding contact window or a succeeding diffusion pattern having a different configuration at a different position from the first configuration and the first position of a recognized diffusion area or a multilayer wiring pattern by adjusting said succeeding wiring pattern, said succeeding contact window or said succeeding diffusion pattern using the first position and the first configuration of the recognized diffusion area or the multilayer wiring pattern which was already formed by using a plotting means or by a photolithography technique.

18. A method of forming a multilayered pattern for a liquid crystal display device comprising a plurality of TFT patterns and a plurality of multilayer wiring patterns formed via a plurality of insulating layers, comprising:

recognizing with recognizing means a first position and a first configuration of at least one of said plurality of TFT patterns or said plurality of multilayer wiring patterns which was already formed in an electronic part; and forming a succeeding TFT pattern or a succeeding multilayer wiring pattern having a different configuration at a different position from the first configuration and the first position of a recognized TFT pattern or a multilayer wiring pattern by adjusting said succeeding TFT pattern or said succeeding multilayer wiring pattern using said first position and said first configuration of the recognized TFT pattern or the multilayer wiring pattern which was already formed by using a plotting means or by a photolithographic technique.

* * * * *